(12) United States Patent
Sano et al.

(10) Patent No.: US 8,081,455 B2
(45) Date of Patent: Dec. 20, 2011

(54) COOLING DEVICE AND METHOD FOR ACOUSTIC APPARATUS

(75) Inventors: Tetsuya Sano, Tokyo (JP); Toshiyuki Takahashi, Tokyo (JP)

(73) Assignee: Sony Corporation, Tokyo (JP)

( * ) Notice: Subject to any disclaimer, the term of this patent is extended or adjusted under 35 U.S.C. 154(b) by 115 days.

(21) Appl. No.: 11/904,480

(22) Filed: Sep. 27, 2007

(65) Prior Publication Data
US 2008/0174959 A1   Jul. 24, 2008

(30) Foreign Application Priority Data

Oct. 5, 2006 (JP) .............................. JP2006-274398

(51) Int. Cl.
*H05K 7/20* (2006.01)
(52) U.S. Cl. ................... 361/695; 361/679.48; 361/690; 236/49.3; 381/189; 713/320; 700/300
(58) Field of Classification Search ............. 361/679.48, 361/103, 688, 689, 690, 694, 695, 697; 381/55, 381/94.1, 189; 369/121; 236/49.3; 257/E23.082; 62/3.2; 700/71, 299
See application file for complete search history.

(56) References Cited

U.S. PATENT DOCUMENTS

| 6,494,381 | B2 * | 12/2002 | Bulthuis ....................... 236/49.3 |
| 6,608,906 | B2 * | 8/2003 | Krochmal et al. ............ 381/189 |
| 7,457,226 | B2 * | 11/2008 | Cho et al. ....................... 369/121 |
| 2003/0138115 | A1 * | 7/2003 | Krochmal et al. ............ 381/94.1 |
| 2005/0111669 | A1 * | 5/2005 | Park et al. ........................ 381/58 |
| 2007/0131409 | A1 * | 6/2007 | Asahi ............................. 165/287 |

FOREIGN PATENT DOCUMENTS

| JP | 62-278808 A | 12/1987 |
| JP | 05-015524 U | 2/1993 |
| JP | 05-100063 | 4/1993 |
| JP | 2001-168646 A | 6/2001 |
| JP | 2003-206887 A | 7/2003 |
| JP | 2003-326961 A | 11/2003 |
| JP | 2006-106981 | 4/2006 |

* cited by examiner

*Primary Examiner* — Courtney Smith
(74) *Attorney, Agent, or Firm* — Wolf, Greenfield & Sacks, P.C.

(57) ABSTRACT

A cooling device for an acoustic apparatus includes a cooling fan that is turned on and off, and adjusted in quantity of airflow in accordance with an apparatus temperature, wherein when the apparatus temperature is lower than a value requiring immediate cooling, and when an audio output is in a mute state, the cooling fan is not changed in operating state.

12 Claims, 7 Drawing Sheets

FIG. 4

TEMPERATURE DETECTION

| TEMPERATURE | A/D INPUT | AD VALUE (Hex) 8bit |
|---|---|---|
| 35°C | 0.53V | 29 |
| 40°C | 0.47V | 24 |
| 50°C | 0.31V | 18 |
| 55°C | 0.24V | 13 |

FIG. 5

FAN Control Mode

| MODE | DC OUTPUT | D/A OUTPUT |
|---|---|---|
| OFF-MODE | 0V | 0V |
| LO-MODE | 7V | 1.7V |
| HI-MODE | 11V | 2.6V |

FIG. 6

RELATIONSHIP BETWEEN TEMPERATURE DETECTION AND FAN-MODE

|  |  | 30 | 40 | 50 | 60 | 70 | 80 | [°C] |
|---|---|---|---|---|---|---|---|---|
| OFF-MODE |  | → | → |  |  |  |  |  |
| LO-MODE |  |  | ← | → |  |  |  |  |
| HI-MODE |  |  |  |  | ← | ← | ← |  |

COOLING DEVICE AND METHOD FOR ACOUSTIC APPARATUS

CROSS REFERENCES TO RELATED APPLICATIONS

The present invention contains subject matter related to Japanese Patent Application JP 2006-274398 filed in the Japanese Patent Office on Oct. 5, 2006, the entire contents of which being incorporated herein by reference.

BACKGROUND OF THE INVENTION

1. Field of the Invention

The present invention relates to cooling devices and methods for acoustic apparatuses and, more specifically, to a cooling device for an acoustic apparatus including a cooling fan that is turned on and off, and adjusted in quantity of airflow in accordance with an apparatus temperature, and a cooling method therefor.

2. Description of the Related Art

For cooling of an electronic apparatus, a cooling fan has been put under control for the purpose. With previous techniques of controlling a cooling fan, the state of a cooling object, i.e., temperature and degree of heat generation, has been extremely simply the factor for turning on and off the cooling fan. That is, when the cooling object is increased in temperature to be higher than a predetermined threshold value, or when the electronic apparatus is put in a state of heat generation, the cooling fan is turned on. On the other hand, when the cooling object is decreased in temperature to be lower than the predetermined threshold value, or when the electronic apparatus is put in a state of no heat generation, the cooling fan is turned off.

With such simple control application over the cooling fan, the cooling effects can be high if the cooling fan is rotated at a high speed during a cooling period. However, if the cooling fan is rotated at a high speed as such for the aim of increasing the cooling effects, fan noise such as rumbling noise and wind noise is generated and often annoys users. Especially with an acoustic apparatus, the sound of a fan turns out to be noise, and thus the performance capabilities thereof are reduced to a considerable degree. For suppressing such fan noise, if an application voltage to the fan or the rotation speed of the fan is reduced, the resulting cooling effects are not enough for the generated amount of heat. This thus increases the apparatus temperature in the acoustic apparatus, and in some cases, this may possibly cause a breakdown of the acoustic apparatus.

As measures against such problems, to reduce the fan noise of a cooling fan as much as possible, a method is proposed to adjust the quantity of airflow of the cooling fan to be in a required value in accordance with the state of a cooling object, i.e., temperature and the degree of heat generation. However, such a method has the following drawbacks. That is, users are annoyed by the sound of change generated when the fan is changed in rotation speed, i.e., when the quantity of airflow is adjusted for the cooling fan. As such, the presence of the fan is made evident, thereby degrading the performance capabilities as an acoustic apparatus.

Patent Document 1 (JP-A-2001-168646) describes a technique of controlling the rotation speed of a fan motor that drives a cooling fan by using three control signals, i.e., an audio output signal level detection signal coming from a comparator in accordance with the output level of a power amplifier, a cabinet temperature detection signal coming from a temperature detection circuit in accordance with the temperature in a cabinet, and a mute signal coming from a mute signal generation circuit. In the technique, a fan motor control circuit increases the rotation speed of the fan motor in response to an output of the audio output signal level detection signal or that of the cabinet temperature detection signal, and forcefully decreases the rotation speed of the fan motor in response to an output of the mute signal. Through such control, the change of rotation speed by the cabinet temperature detection signal takes precedence over the change of rotation speed by any other control signals. Refer also to Patent Document 2 (JP-A-2003-206887).

With such a configuration, when the output of a mute signal is provided in response to the acoustic apparatus being put in the mute state, control is accordingly so exercised that the fan motor is forcefully decreased in rotation speed. That is, when a mute signal is generated, the fan motor is changed in rotation speed. As such, at such speed change, the sound of change resulted therefrom annoys users, thereby making the presence of the fan evident. The technique described in Patent Document 1 is not yet solving the problem of degrading the performance capabilities as an acoustic apparatus.

SUMMARY OF THE INVENTION

There is a need for providing a cooling device for an acoustic apparatus that can protect the acoustic apparatus from performance degradation possibly caused by fan noise of a cooling fan such as rumbling noise and wind noise.

There is another need for providing a cooling device for an acoustic apparatus that can protect the acoustic apparatus from performance degradation possibly caused by the presence of a cooling fan that is made evident by any noise generated by change of rotation speed of the cooling fan when the cooling fan is adjusted in quantity of airflow.

There is a further need for providing a cooling device for an acoustic apparatus that can protect the acoustic apparatus from breakdown by sufficiently cooling the acoustic apparatus whenever needed to prevent abnormal increase of the apparatus temperature with the suppression of fan noise such as rumbling noise and wind noise.

These and other needs will become more apparent from the following detailed description of the technical concept of the present invention and embodiments thereof.

According to an embodiment of the present invention, there is provided a cooling device for an acoustic apparatus including a cooling fan that is turned on and off, and adjusted in quantity of airflow in accordance with an apparatus temperature. In the cooling device, when the apparatus temperature is lower than a value requiring immediate cooling, and when an audio output is in a mute state, the cooling fan is not changed in operating state.

In the configuration, the cooling fan may be changed in rotation in accordance with the apparatus temperature, or the cooling fan may be driven by being changed in mode from/to low to/from high in terms of rotation speed in accordance with the apparatus temperature. When the apparatus temperature is equal to or higher than the value requiring immediate cooling, the acoustic apparatus may be forcefully cooled irrespective of whether the audio output is in the mute state or not. The acoustic apparatus may include an optical disk player as an audio source. The apparatus temperature may be detected by a thermistor. The apparatus temperature may be detected by the thermistor, and the thermistor may be disposed on a circuit board to be located below an optical pickup of the optical disk player.

According to another embodiment of the present invention, there is provided a cooling method for an acoustic apparatus including the steps of: performing cooling by turning on and off a cooling fan and adjusting the cooling fan in quantity of airflow in accordance with an apparatus temperature, and controlling an operating state of the cooling fan such that the operating state is not changed when the apparatus temperature is lower than a value requiring immediate cooling, and when an audio output is in a mute state.

In the method, when the apparatus temperature is equal to or higher than the value requiring immediate cooling, the acoustic apparatus may be forcefully cooled irrespective of whether the audio output is in the mute state or not. The mute state may be brought about at a time when the audio output is 0, when an audio source is switched, when power is being turned off, and when the acoustic apparatus is being in a menu mode.

A preferable embodiment of the invention is directed to a fan control device that is mounted in an acoustic apparatus for the aim of cooling the apparatus. With the fan control device, the apparatus temperature of the acoustic apparatus is used as a basis to turn on or off a fan, and adjust the quantity of airflow of the fan, i.e., rotation speed and voltage, to be in a required value. The timing of turning on and off the fan, and the timing of adjusting the quantity of airflow are put under control based on the audio output of the acoustic apparatus, i.e., whether the output is in a mute state or not.

Such a fan control device can eliminate the presence of a fan as much as possible by suppressing fan noise that is often audible when the fan is turned on or when the quantity of airflow thereof is adjusted, i.e., by turning on and off the fan or adjusting the quantity of airflow thereof only when any audio is being output while effectively cooling a heat-generating object in accordance with the apparatus temperature. As such, with no degradation of performance capabilities as an acoustic apparatus by a fan, the heat-generating object in the acoustic apparatus can be cooled with good efficiency.

An embodiment of the invention is directed to a cooling device for an acoustic apparatus including a cooling fan that is turned on and off, and adjusted in quantity of airflow in accordance with an apparatus temperature. In the cooling device, when the apparatus temperature is lower than a value requiring immediate cooling, and when an audio output is in a mute state, the cooling fan is not changed in operating state.

As such, with the cooling device for the acoustic apparatus, when the audio output is in the mute state, the cooling fan shows no change of operating state. In such a mute state, no sound change is thus generated even if the cooling fan is changed in rotation speed, thereby preventing users from being annoyed by the presence of the cooling fan. Accordingly, the problems of degrading the performance capabilities as an acoustic apparatus can be favorably avoided. What is more, no measure is taken to hinder the change of the operating state when the apparatus temperature is higher than a value requiring immediate cooling, the apparatus temperature can be favorably prevented from being abnormally increased.

BRIEF DESCRIPTION OF THE DRAWINGS

FIG. 4 is a table showing the correlation between output voltages and detection temperatures of a thermistor;

FIG. 5 is a table showing output voltages of the respective MODEs;

FIG. 6 is a table showing the relationship between detection temperatures and fan MODEs;

DETAILED DESCRIPTION OF THE INVENTION

Figure 1:
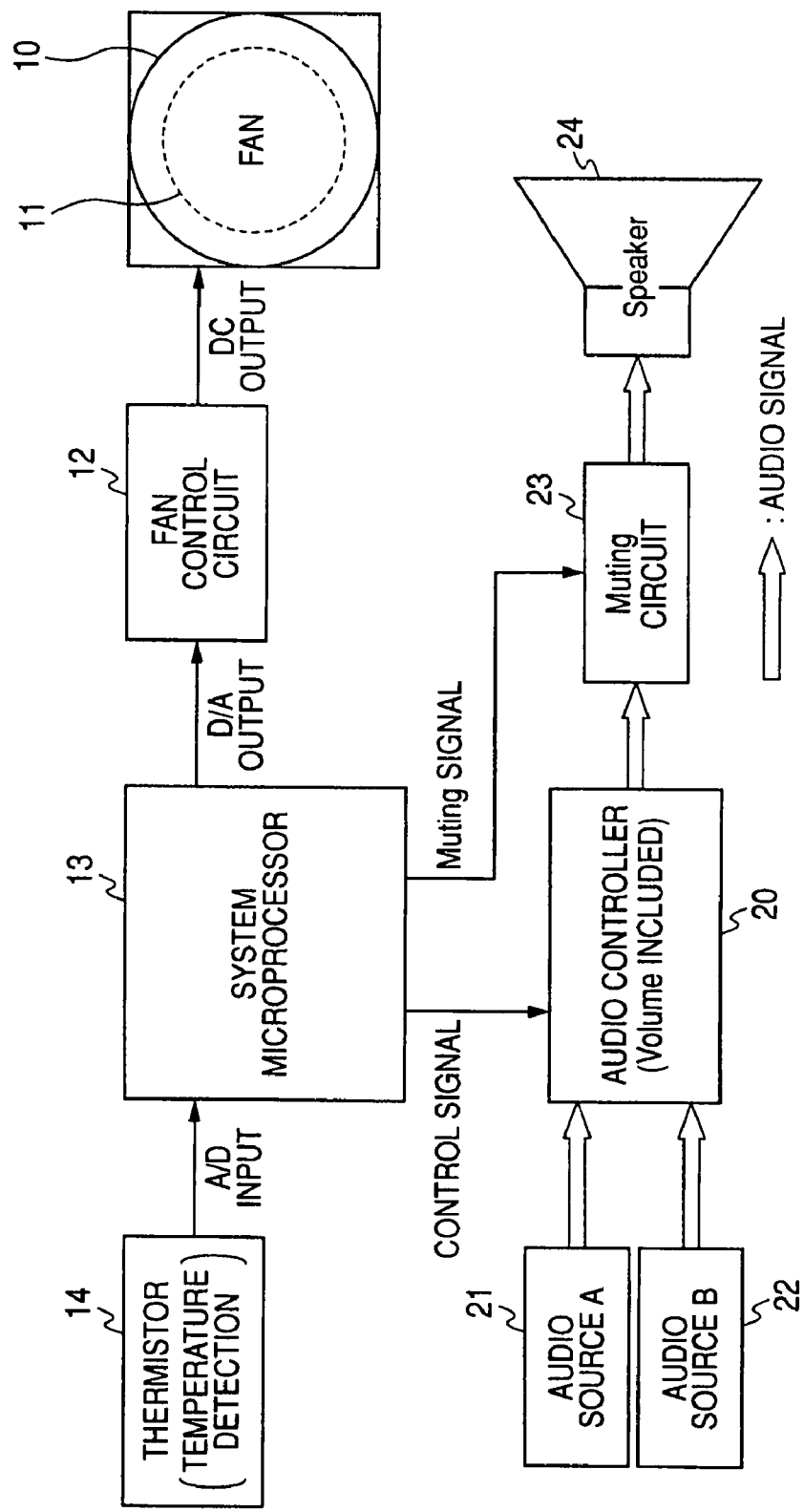
FIG. 1 is a block diagram showing the system configuration of a cooling device.

An embodiment of the invention is described in the below by referring to the accompanying drawings. FIG. 1 shows the system configuration of a cooling device in its entirety equipped in an acoustic apparatus of the embodiment. This cooling device is provided with a cooling fan 10, which is driven by a direct-coupled fan motor 11. The fan motor 11 is connected with a fan control circuit 12, which is in charge of controlling the rotation speed and voltage of the fan motor 11. The fan control circuit 12 is connected also with a system microprocessor 13. On the input end of this system microprocessor 13, a thermistor 14 is connected for use to detect the apparatus temperature of the acoustic apparatus.

The system microprocessor 13 is connected to an audio controller 20 over a control signal line. This audio controller 20 is connected with, on the input end, an audio source 21 being an optical disk player, and another audio source 22 being a tape player. Herein, the audio controller 20 is surely connected with any other audio sources whenever needed. The audio controller 20 is connected with, on the output end, a muting circuit 23, and the muting circuit 23 is connected with, on the output end, a speaker 24. When not in a mute state, this muting circuit 23 supplies an audio signal coming from the audio controller 20 to the speaker 24, and the audio is reproduced by the speaker 24.

Figure 2:
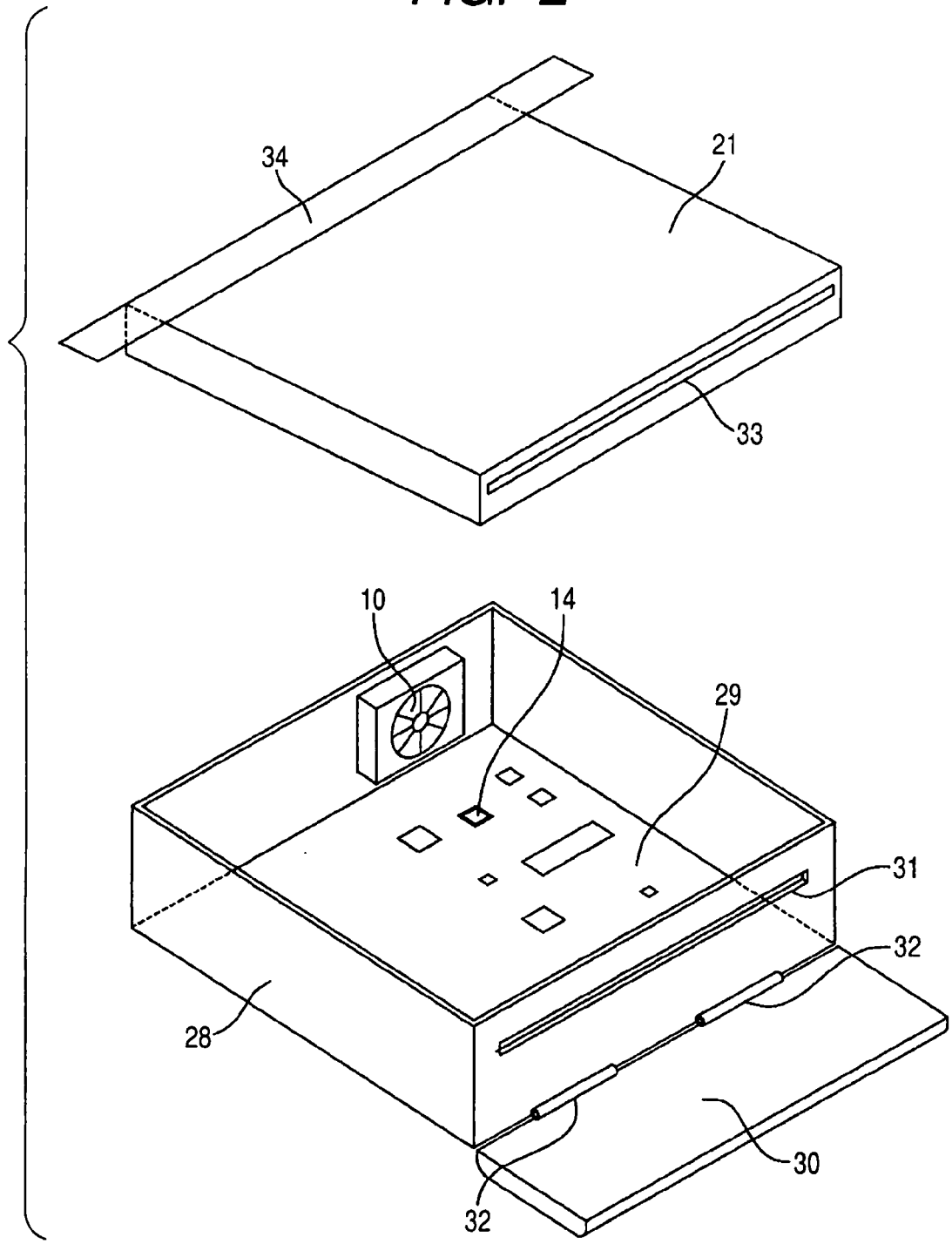
FIG. 2 is an exploded perspective diagram of a main part of an in-vehicle acoustic apparatus including an optical disk player as an audio source.

By referring to FIG. 2, described next is the configuration of the acoustic apparatus including such a cooling device. This acoustic apparatus is exemplified by a multi disk player 21 for use in a vehicle, i.e., disk player 21 of reproducing optical disks of various formats. The optical disk player 21 is housed in a box-shaped chassis 28 with a space from the bottom portion thereof. The chassis 28 carries therein, at the bottom portion, a circuit board 29. The chassis 28 is provided with, on the front end side, a front panel 30 to be able to freely rotate via a hinge 32. The chassis 28 is also provided with, on the front end side, a slit-shaped insertion port 31. The optical disk player 21 is formed with a slit-shaped insertion port 33 corresponding to the slit-shaped insertion port 31 formed to the chassis 28. The optical disk player 21 is fixed to the chassis 28 by a support bar 34 provided on the upper surface thereof.

Figure 3:
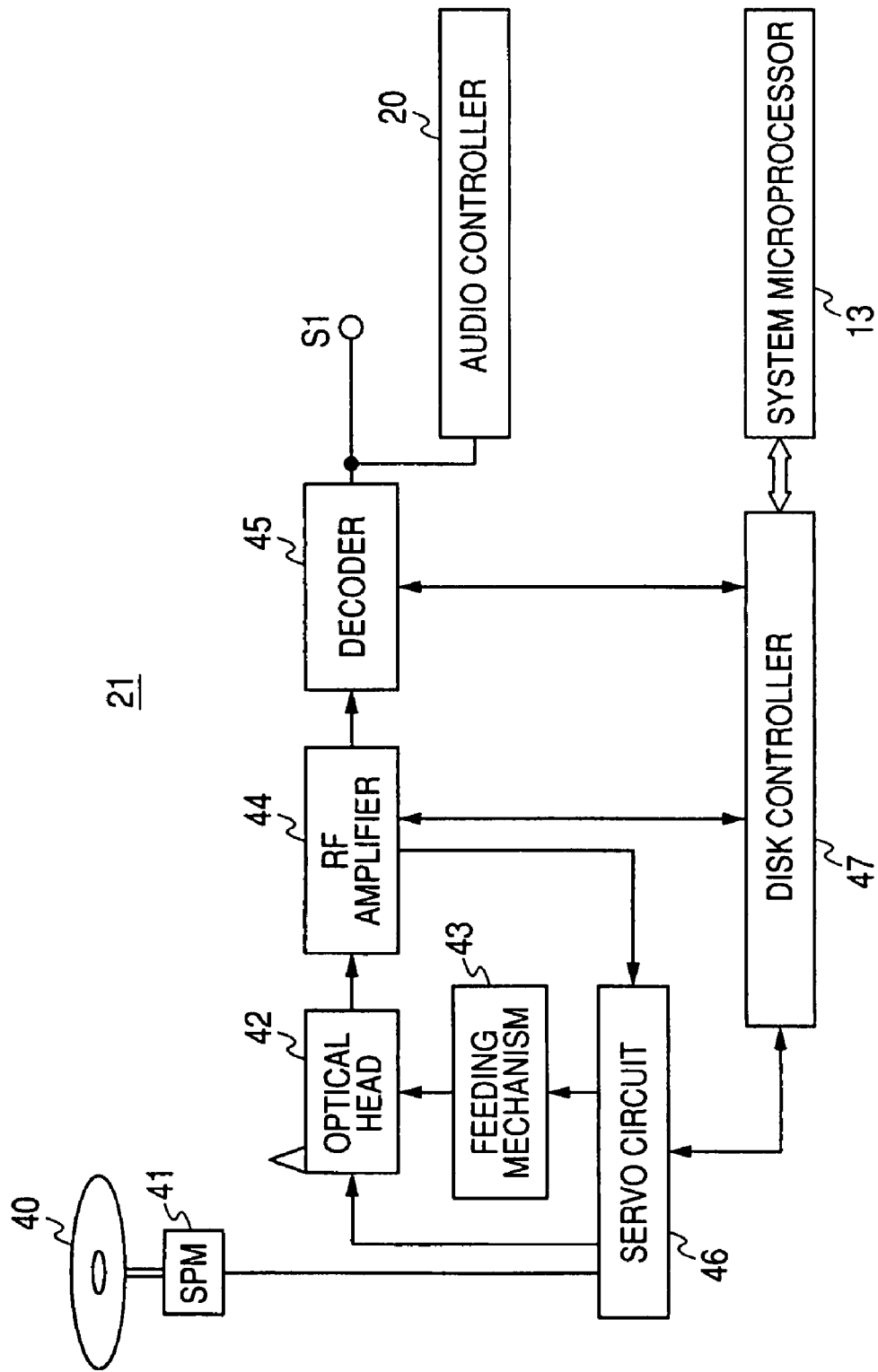
FIG. 3 is a block diagram showing the configuration of the optical disk player serving as an audio source.

By referring to FIG. 3, described next is the optical disk player 21 configuring the audio source 21. An optical disk 40 is to be loaded through the slit-shaped insertion port 33. During the reproduction operation, the disk 40 is rotate-driven by a spindle motor 41 with a constant linear velocity (CLV). The optical disk 40 is then subjected to reading of data by an optical head 42 for supply to an RF amplifier 44. The data to be read at this time is the one stored in pits on the optical disk 40.

For data reading from the optical disk 40, the optical head 42 is provided therein with a laser diode serving as a laser light source (not shown), a photo-detector for use to detect any reflected lights, an objective lens serving as an output source of laser beams, an optical system that irradiates laser lights onto a recording surface of the optical disk 40 via the objective lens, and guides the reflected lights to the photodetector, and others. The objective lens in the optical head 42 is kept hold to be able to move by a dual-axis servo mechanism in the directions of tracking and focusing. The optical head 42 is able to move in its entirely by a feeding mechanism 43 in the radius direction of the optical disk 40.

The RF amplifier 44 generates not only a reproduction RF signal but also a focus error signal and a tracking error signal. These error signals are supplied to a servo circuit 46. From the focus error signal and the tracking error signals, the servo circuit 46 generates various types of signals, i.e., a focus drive signal, a tracking drive signal, and a feeding drive signal, and exercises control thereby over the operation of the dual-axis mechanism in the optical head 42 and the feeding mechanism 43. The servo circuit 46 generates a feeding mechanism control signal, and exercises control over the operation of the feeding mechanism 43 so that the optical head 42 is moved. The signal generation is made in accordance with a reduction component of the tracking error signal, and an access command signal coming from a disk controller 47. The servo circuit 46 generates a spindle drive signal based on a spindle error signal and a spindle kick/brake signal coming from a decoder 45 or the disk controller 47 so that the operation of the spindle motor 41 is controlled.

The reproduction RF signal coming from the RF amplifier 44 is supplied to the decoder 45. In the decoder 45, information read from the optical disk 40 by EFM demodulation, CIRC decoding, and others is subjected to 16-bit quantization, and decoded to digital audio data S1 of 44.1 KHz sampling. The resulting digital audio data S1 is supplied to the audio controller 20 being a digital signal processor, for example. In the decoder 45, control data such as TOC data and sub-code is extracted. These signals are supplied to the disk controller 47 for use for various types of control application.

In the acoustic apparatus including such an optical disk player as one of the audio sources 21, as shown in FIG. 4, the thermistor 14 disposed on the circuit board 29 at the bottom portion of the chassis 28 is so configured as to generate an output voltage corresponding to a temperature whatever detected. This output voltage is supplied to the system microprocessor 13 of FIG. 1. The system microprocessor 13 generates a D/A (Digital-to-Analog) output corresponding to the A/D (Analog-to-Digital) input, and this D/A output is supplied to the fan control circuit 12.

As shown in FIG. 5, the fan control circuit 12 being under the control of the system microprocessor 13 exercises control over the fan motor 11 of the cooling fan 10 in three levels, e.g., with OFF-MODE, the output of the fan control circuit 12 is 0V, with LO-MODE, the DC output is 7V, and with HI-MODE, the DC output is 11V. Based on the outputs as such, the fan motor 11 of the cooling fan 10 is controlled in terms of rotation speed and quantity of airflow.

As shown in FIG. 6, when the thermistor 14 detects the temperature of 40° C. and lower, the cooling fan 10 is in the OFF-MODE. When the detected temperature exceeds 40° C., the cooling fan 10 is changed in mode to LO-MODE. When the detected temperature exceeds 55° C., the cooling fan 10 is changed in mode to HI-MODE. On the other hand, when the temperature shows a decrease, i.e., when the temperature is decreased down to 50° C., the cooling fan 10 is changed in mode to LO-MODE, and when the temperature is decreased down to 35° C. in LO-MODE, the cooling fan 10 is changed in mode to OFF-MODE. That is, the threshold temperature for mode change from OFF-MODE to LO-MODE is 40° C., and the threshold temperature for mode change from LO-MODE to OFF-MODE is 35° C. so that a hysteresis of 5° C. is set. On the other hand, the mode change from LO-MODE to HI-MODE is made at 55° C., and the mode change from HI-MODE to LO-MODE is made at 50° C. so that a hysteresis of 5° C. is also set. As such, this prevents switch chattering for the cooling fan 10 so that the switching operation can be smoothly executed.

Figure 7:
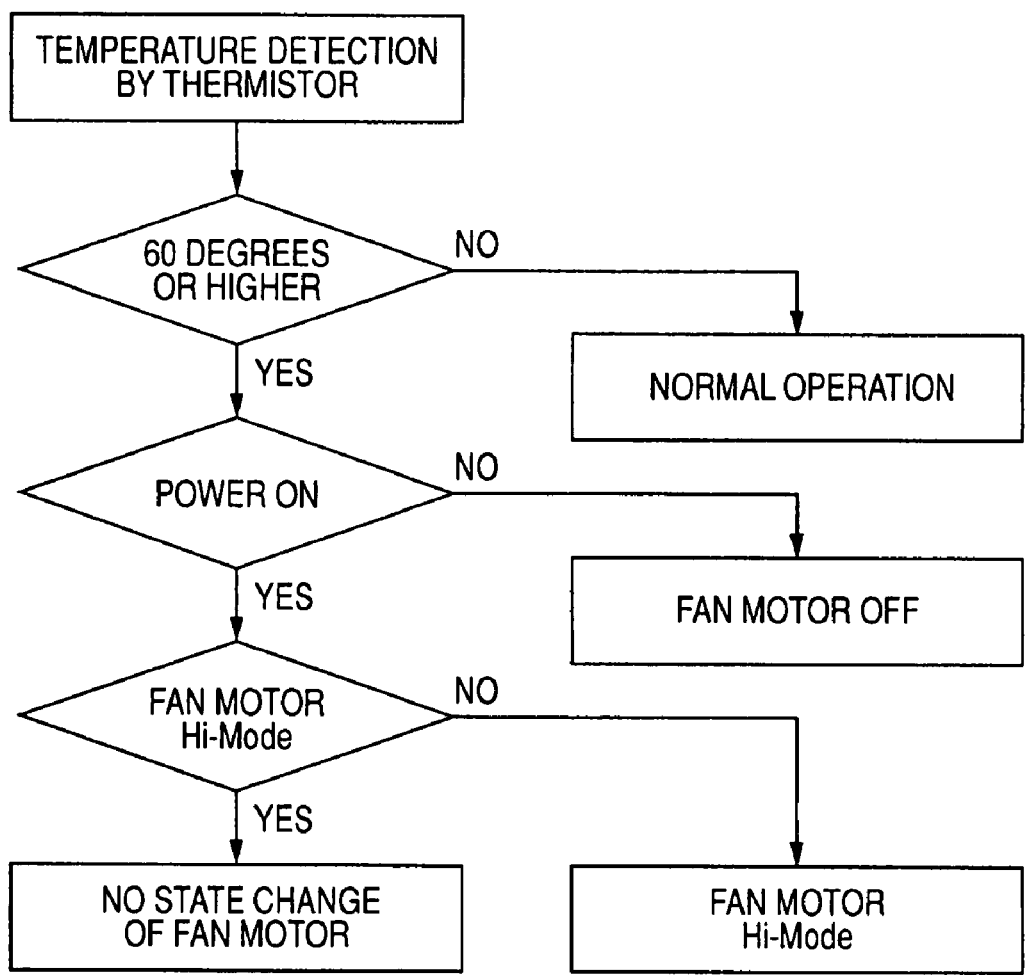
FIG. 7 is a flowchart of the control operation in its entirety.

FIG. 7 shows a flowchart for control of the system microprocessor 13 for the switching operation in accordance with the temperature detected by the thermistor 14. When the temperature detected by the thermistor 14 is less than 60° C., the procedure goes to the normal operation of FIG. 8. When the temperature detected by the thermistor 14 is 60° C. or higher, the temperature is determined as being required immediate cooling. In this case, when the power is ON, and when the fan motor is not operating in the HI-MODE, the fan motor is changed in mode to HI-MODE for cooling. That is, in this case, for immediate cooling, the forceful cooling is taken place. When the fan motor 11 is being operated already in the HI-MODE, the state is retained.

With the control operation of the cooling fan 10, the apparatus temperature of the acoustic apparatus is used as a basis to turn on or off the cooling fan 10, and adjust the quantity of airflow of the fan, i.e., rotation speed and voltage, to be in a required value. The timing of turning on and off the fan, and the timing of adjusting the quantity of airflow are put under control based on the audio output of the acoustic apparatus, i.e., whether the output is in a mute state or not, so that the noise of the cooling fan 10 is suppressed not to be audible. Such control in the mute state is exercised in accordance with the flowchart of FIG. 8. Note here that this flowchart corresponds to the sub-routine of the normal operation of FIG. 7.

In the normal operation, the temperature is derived from the output of the thermistor 14. When the temperature is equal to or lower than 40° C., the fan motor 11 is turned OFF. When the temperature is higher than 40° C., a determination is made whether the value is in the range of 40 to 50° C. When the temperature falls in the range, and when the output is not in the mute state, the fan motor is changed in mode to LO-MODE. On the other hand, when the output is in the mute state, the fan motor is not changed in state. When the value of the temperature is exceeding the range of 40 to 50° C., a determination is made whether the state is of mute. When the state is not of mute, the rotation of the fan motor is changed to HI-MODE. When the output is in the mute state, the fan motor is not changed in state.

As such, with the state of mute when the apparatus temperature is in the range of 40 to 50° C., and when the value is 50° C. or higher but 60° C. or lower, the fan motor is not changed in state, and the state is retained. As such, in the mute state, in both ranges of 40 to 50° C. and 50 to 60° C., the cooling fan 10 remains in the same rotation state with the same rotation speed. As such, no sound of change is generated when the cooling fan 10 is changed in rotation speed, and thus no user is annoyed by the sound of change, whereby no performance degradation is observed for the acoustic apparatus that is often caused by the presence of the cooling fan 10 being made evident.

Figure 8:
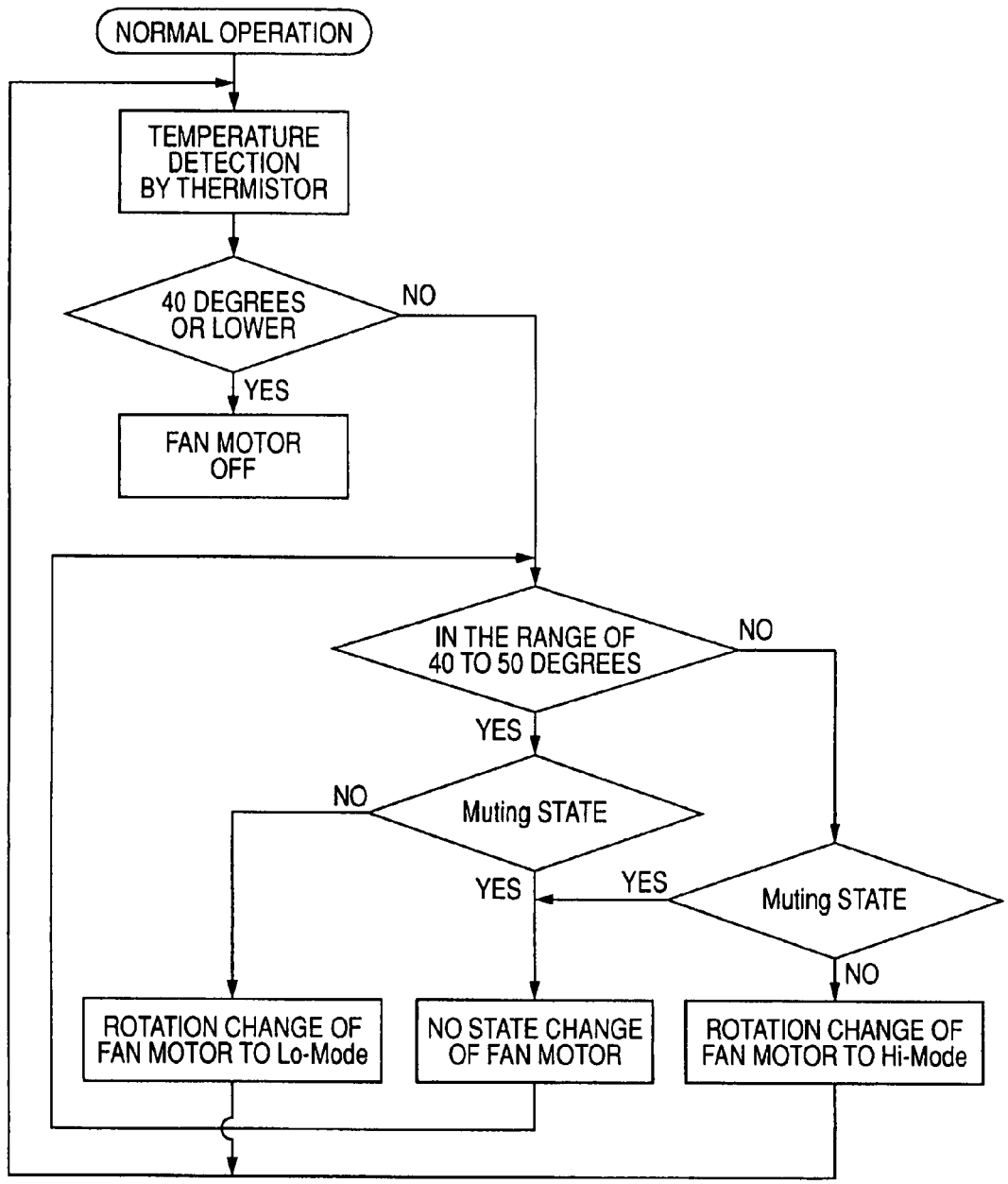
FIG. 8 is a flowchart of a subroutine of normal operation.
Figure 9:
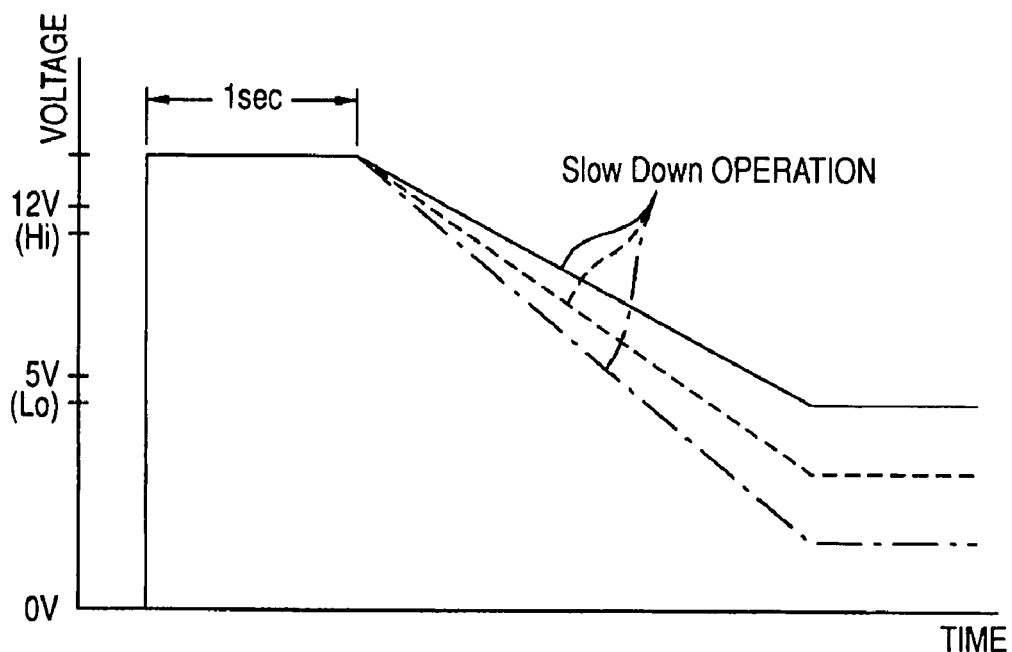
FIG. 9 is a graph showing the operation of starting LO-MODE.
Figure 10:
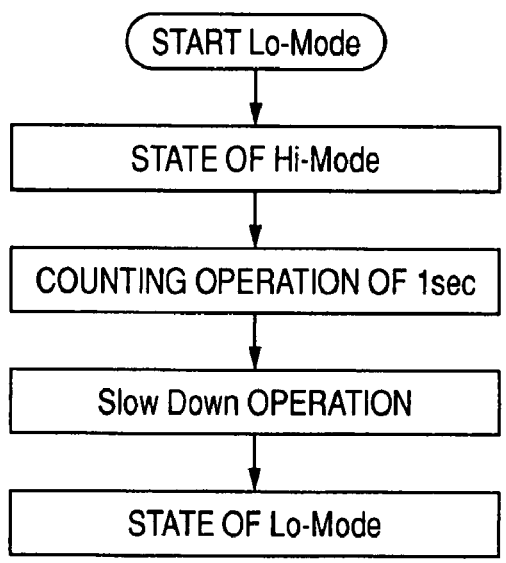
FIG. 10 is a flowchart of an operation starting the LO-MODE.

With the cooling device of such an acoustic apparatus, as shown in FIG. 8, when the temperature falls in the range of 40 to 50° C., and when the state is not of mute, the rotation speed of the fan motor is changed, and the mode is changed to LO-MODE. As shown in FIGS. 9 and 10, for such mode change to LO-MODE, the mode is once changed to HI-MODE, and after a second in the Hi-MODE, the speed is slowed down and the mode is changed to LO-MODE. By mode change into HI-MODE for once, the LO-MODE can be activated in a considerably smooth manner so that the cooling fan 10 can be smoothly activated with LO-MODE so that any predetermined quantity of airflow and rotation speed can be derived without any delay.

FIG. 10 is a flowchart of such mode change to LO-MODE, i.e., after mode change to HI-MODE, a counting operation is executed to count a second, and then the speed is slowed down so that the mode change to LO-MODE is controllably made.

Note that, in the embodiment, the mute state of FIG. 8 includes not only the muting operation of the muting circuit 23 by the system microprocessor 13 but also the menu operation of the optical disk player 21, the operation when the audio output by the audio controller 20 is 0, the mode change operation of the audio sources 21 and 22, or the operation when the audio sources 21 and 22 of the acoustic apparatus are both being turned OFF. In these cases, the cooling fan 10 is controlled while the acoustic apparatus being put in the mute state. As such, the mute state includes a state when a volume level is smaller than a predetermined value. The volume level here is a result of monitoring the level of an audio signal to be supplied to the speaker 24.

While the invention has been described with reference to the embodiments illustrated in the figures, the invention is not limited to the embodiments and various modifications can be made within the scope of the technical concept of the invention. For example, a temperature for use as a threshold value in the embodiment may be set in many other different manners. Moreover, the invention is widely applicable to an acoustic apparatus including an audio source, which is not restrictive to an optical disk player and a tape player.

It should be understood by those skilled in the art that various modifications, combinations, sub-combinations and alterations may occur depending on design requirements and other factors insofar as they are within the scope of the appended claims or the equivalents thereof.

What is claimed is:

1. A cooling device for an acoustic apparatus comprising:
a cooling fan that is turned on and off and adjusted in quantity of airflow generated in accordance with a temperature of the apparatus, wherein
if the cooling fan is on and the apparatus temperature reaches a temperature that is lower than a first temperature and higher than a second temperature, the first temperature being a temperature above which immediate cooling of the apparatus is needed, the second temperature being a temperature below which the cooling fan is ineffective at cooling the apparatus, then:
if an audio output is in a mute state, the cooling fan remains on; and
if the audio output is not in a mute state, the cooling fan is turned off.

2. The cooling device for the acoustic apparatus according to claim 1, wherein
the cooling fan is changed in rotation in accordance with the apparatus temperature.

3. The cooling device for the acoustic apparatus according to claim 1, wherein
the cooling fan is driven by being switched between a high mode and a low mode in terms of rotation speed in accordance with the apparatus temperature.

4. The cooling device for the acoustic apparatus according to claim 1, wherein
when the apparatus temperature is equal to or higher than the first temperature, the acoustic apparatus is forcefully cooled irrespective of whether the audio output is in the mute state or not.

5. The cooling device for the acoustic apparatus according to claim 1, wherein
the acoustic apparatus includes an optical disk player as an audio source.

6. The cooling device for the acoustic apparatus according to claim 5, wherein
the apparatus temperature is detected by a thermistor.

7. The cooling device for the acoustic apparatus according to claim 6, wherein
the apparatus temperature is detected by the thermistor, and the thermistor is disposed on a circuit board to be located below an optical pickup of the optical disk player.

8. A cooling method for an acoustic apparatus comprising:
performing cooling by turning on and off a cooling fan and adjusting the quantity of airflow generated by the cooling fan in accordance with a temperature of the apparatus; and
controlling an operating state of the cooling fan such that if the cooling fan is on and the apparatus temperature reaches a temperature that is lower than a first temperature and higher than a second temperature, the first temperature being a temperature above which immediate cooling of the apparatus is needed, the second temperature being a temperature below which the cooling fan is ineffective at cooling the apparatus, then:
if an audio output is in a mute state, the cooling fan remains on; and
if the audio output is not in a mute state, the cooling fan is turned off.

9. The cooling method for the acoustic apparatus according to claim 8, further comprising:
forcefully cooling the acoustic apparatus irrespective of whether the audio output is in the mute state when the apparatus temperature is equal to or higher than the first temperature.

10. The cooling method for the acoustic apparatus according to claim 8, further comprising:
bringing about the mute state at a time when the audio output is 0, when an audio source is switched, when power is being turned off, and when the acoustic apparatus is in a menu mode.

11. The cooling device of claim 1, wherein if the cooling fan is off, the apparatus temperature reaches a temperature that is lower than the first temperature, and the audio output is in a mute state, then the cooling fan remains off.

12. The cooling method for the acoustic apparatus according to claim 8, further comprising controlling an operating state of the cooling fan such that if the cooling fan is off, the apparatus temperature reaches a temperature that is lower than the first temperature, and the audio output is in a mute state, then the cooling fan remains off.

* * * * *